(12) United States Patent
Baek et al.

(10) Patent No.: US 10,362,664 B2
(45) Date of Patent: Jul. 23, 2019

(54) SYSTEM, METHOD AND APPARATUS FOR TARGET MATERIAL DEBRIS CLEANING OF EUV VESSEL AND EUV COLLECTOR

(71) Applicant: ASML Netherlands B.V., Veldhoven (NL)

(72) Inventors: Jonghoon Baek, San Diego, CA (US); Mathew Cheeran Abraham, San Diego, CA (US); David Robert Evans, San Diego, CA (US); Jack Michael Gazza, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/887,935

(22) Filed: Feb. 2, 2018

(65) Prior Publication Data

US 2018/0160517 A1    Jun. 7, 2018

Related U.S. Application Data

(63) Continuation of application No. 15/003,385, filed on Jan. 21, 2016, now Pat. No. 9,888,554.

(51) Int. Cl.
*H05G 2/00* (2006.01)
*G03F 7/20* (2006.01)
*G02B 19/00* (2006.01)
*G02B 27/00* (2006.01)

(52) U.S. Cl.
CPC ......... *H05G 2/005* (2013.01); *G02B 19/0095* (2013.01); *G02B 27/0006* (2013.01); *G03F 7/70033* (2013.01); *G03F 7/70175* (2013.01); *G03F 7/70925* (2013.01); *G03F 7/70933* (2013.01); *H05G 2/008* (2013.01)

(58) Field of Classification Search
USPC ................... 250/504 R; 134/1.1, 1.2, 21
See application file for complete search history.

(56) References Cited

U.S. PATENT DOCUMENTS 9,888,554 B2 * 2/2018 Baek .................. H05G 2/005
2012/0223256 A1 * 9/2012 Bykanov ............ G03F 7/70925
250/504 R \* cited by examiner

*Primary Examiner* — Kiet T Nguyen
(74) *Attorney, Agent, or Firm* — Arent Fox LLP

(57) ABSTRACT

A system and method of removing target material debris deposits simultaneously with generating EUV light includes generating hydrogen radicals in situ in the EUV vessel, proximate to the target material debris deposits and volatilizing the target material debris deposits and purging the volatilized target material debris deposits from the EUV vessel without the need of an oxygen containing species in the EUV vessel.

10 Claims, 19 Drawing Sheets

SYSTEM, METHOD AND APPARATUS FOR TARGET MATERIAL DEBRIS CLEANING OF EUV VESSEL AND EUV COLLECTOR

CLAIM FOR PRIORITY

This application is a continuation of U.S. application Ser. No. 15/003,385, filed Jan. 21, 2016. The disclosure of this application from which priority is claimed is incorporated by reference herein in its entirety for all purposes.

BACKGROUND

Extreme ultraviolet (EUV) light is used in applications such as extreme ultraviolet lithography (EUVL).

The extreme ultraviolet (EUV) light may be generated using an EUV source in which a target material is irradiated by a high power laser source. The irradiation of the target material by the laser source leads to the generation of plasma which emits EUV light.

An EUV collector situated in an EUV vessel collects and focuses the EUV light emitted by the plasma. The collected EUV light is directed out of the EUV vessel and into an EUV consuming system such as an extreme ultraviolet lithography system (EUVL).

Significant portions of the target material are distributed around the EUV vessel as target material debris when the target material is irradiated by the high power laser source. The target material debris deposits on the EUV collector and the various internal surfaces within the EUV vessel. The target material debris deposits on the EUV collector reduce the collection performance of the EUV collector. The target material debris deposits on the internal surfaces of the EUV vessel can eventually flake off the internal surfaces and come to rest on the EUV collector, further diminishing the collection performance of the EUV collector.

It is within this context that embodiments arise.

SUMMARY

Broadly speaking, the present invention fills these needs by providing a system and method for generating hydrogen radicals H* in situ in the EUV vessel, proximate to the target material debris deposits. It should be appreciated that the present invention can be implemented in numerous ways, including as a process, an apparatus, a system, computer readable media, or a device. In situ cleaning provides the capability of cleaning of EUV collector and EUV vessel simultaneously with generating EUV light. In situ cleaning allows the EUV generation operation is not required to be interrupted for cleaning the EUV collector and the EUV vessel. Several inventive embodiments of the present invention are described below.

One embodiment provides a system for removing target material debris deposits simultaneously with generating EUV light includes generating hydrogen radicals in situ in the EUV vessel, proximate to the target material debris deposits and volatilizing the target material debris deposits and purging the volatilized target material debris deposits from the EUV vessel without the need of an oxygen containing species in the EUV vessel.

Another embodiment provides an EUV light source including an EUV vessel including an EUV vessel purge gas inlet coupled to a purge gas source capable of dispensing a quantity of purge gas into the EUV vessel. An EUV collector is disposed in the EUV vessel. The EUV collector including a reflective surface. A target material source is capable of dispensing a quantity of target material into the EUV vessel. A first portion of the quantity of target material is disposed on at least a portion of the reflective surface of the EUV collector as a first target material debris deposit. A first hydrogen radical source is disposed within the EUV vessel. The first hydrogen radical source including a first hydrogen radical source outlet disposed proximate to the reflective surface of the EUV collector. The first hydrogen radical source also includes a first hydrogen source inlet coupled to a hydrogen source, a first hydrogen source electrode coupled to a first signal source and a second hydrogen source electrode coupled to a second signal source. The first hydrogen radical source being capable of producing a first quantity of hydrogen radicals and dispensing the first quantity of hydrogen radicals from the first hydrogen radical source outlet. The first quantity of hydrogen radicals capable of combining with the first target material debris deposit to form a first quantity of a volatile compound containing at least a portion of the first target material debris deposit. An EUV vessel purge outlet is included in the EUV vessel and is capable of passing the first quantity of the volatile compound out of the EUV vessel.

The hydrogen radical source can include a hydrogen plasma chamber such as a capacitively or inductively coupled hydrogen plasma chamber. One of the electrodes used for generating the hydrogen radicals can be a portion of a conductive layer of the EUV collector. The hydrogen radical source outlet can be disposed around a perimeter of the EUV collector or disposed near a central aperture of the EUV collector. The hydrogen radical source can be disposed near one or more baffles in the EUV vessel.

The hydrogen radicals are produced proximate to the target material debris deposits and thus do not require an oxygen containing specie to extend the time before the hydrogen radicals recombine to form hydrogen gas and thus oxygen containing specie can be prevented from entering the EUV vessel.

Another embodiment provides a method of cleaning a target material debris deposits in an EUV light source while simultaneously generating EUV light in the EUV light source. The method includes generating a quantity of hydrogen radicals within an EUV vessel of the EUV light source and outputting the generated quantity of hydrogen radicals proximate to the target material deposit on a surface inside the EUV vessel. A first quantity of a volatile compound containing at least a portion of the first portion the target material deposit is formed. A sufficient quantity of purge gas is dispensed into the EUV vessel and the first quantity of the volatile compound is purged out of the EUV vessel though an EUV vessel purge outlet.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Figure 1A:
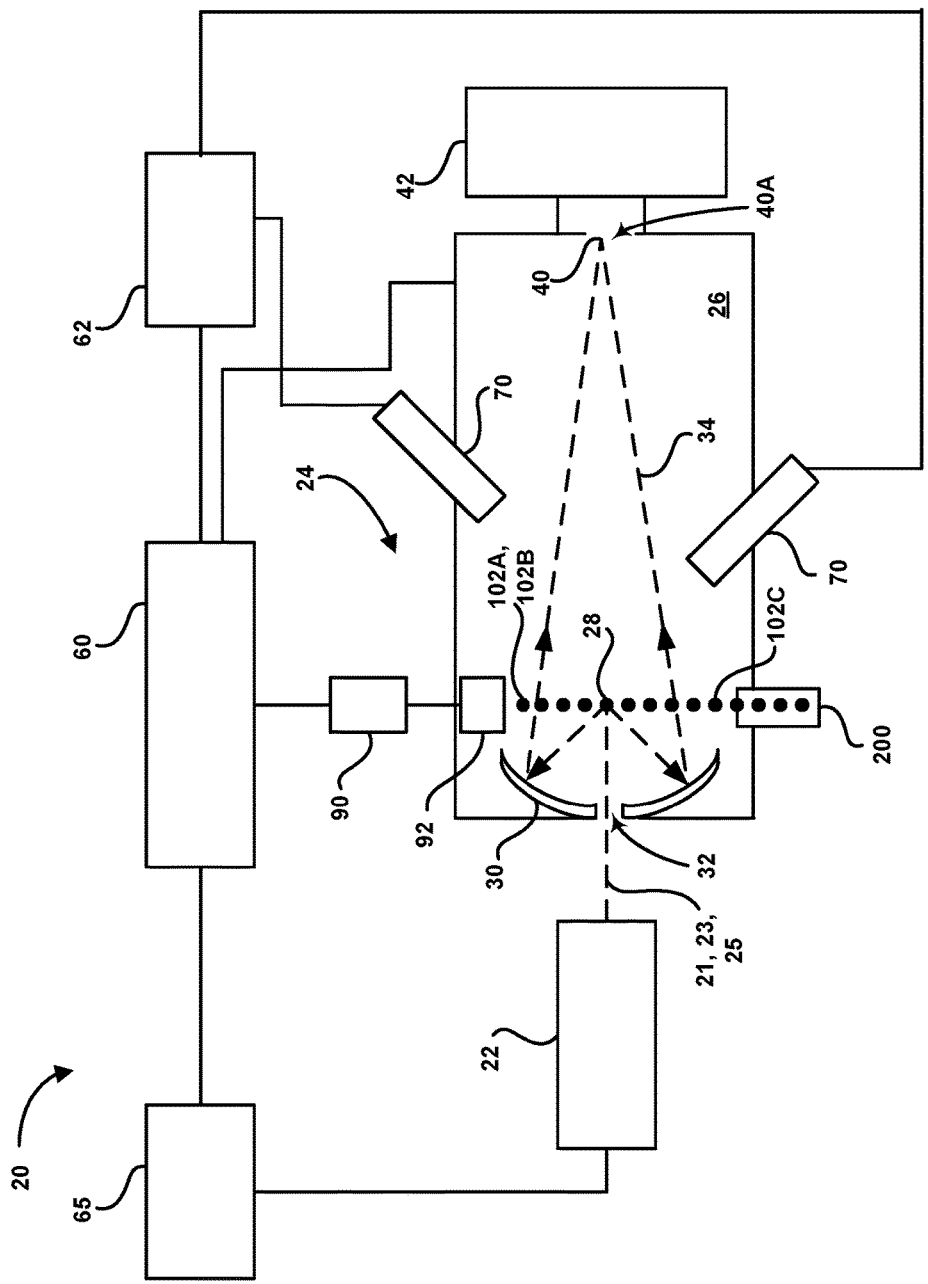
FIG. 1A is a simplified schematic view of a laser-produced-plasma EUV light source, in accordance with embodiments of the disclosed subject matter.

Several exemplary embodiments for removing target material debris from the EUV vessel using in-situ hydrogen radical generators will now be described. It will be apparent to those skilled in the art that the present invention may be practiced without some or all of the specific details set forth herein.

Several different types of target materials can be used for generating EUV emitting plasma. One implementation utilizes tin and/or tin compounds. Some examples of tin containing target materials include pure tin, tin compounds including one or more of $SnBr_4$, $SnBr_2$, $SnH_4$, and tin alloys including one or more of tin-gallium alloys, tin-indium alloys, tin-indium-gallium alloys, and combinations thereof.

Unfortunately the tin containing debris can contaminate many of the inside surfaces of the EUV vessel and most specifically the EUV collector. Several approaches have been tried in the past to remove the tin containing debris. One approach includes injecting hydrogen into the EUV vessel to convert the deposited tin to a volatile tin compound such as $SnH_4$ that can then be purged from the EUV vessel. Unfortunately, merely injecting hydrogen results in a relatively slow conversion of the deposited tin to the volatile tin compounds.

In one example implementation, hydrogen radicals, including H+ and/or H– ions, can be generated using a microwave hydrogen radical generator located externally from the EUV vessel. Unfortunately, by the time the hydrogen radicals arrived inside the EUV vessel, most of the hydrogen radicals had combined to form H2 hydrogen gas.

In one approach to ensure delivery of a greater number of hydrogen radicals, oxygen, and more specifically water vapor, can be injected with the hydrogen radicals. As a result, the numbers of hydrogen radicals that arrive within the EUV vessel is sufficient to perform the desired combination with the deposited tin to form volatile tin compounds. However, injecting oxygen or water vapor into the EUV vessel requires that the EUV generation process carried out within the EUV vessel must be terminated during the presence of oxygen or water vapor as the oxygen and/or water vapor causes problems with the EUV generation process.

One implementation disclosed herein is to increase the conversion of the deposited tin to volatile tin compounds by generating hydrogen radicals, including H+ and/or H– ions, in a hydrogen radical source disposed in-situ in the EUV vessel. The hydrogen radical source will produce hydrogen radicals in high concentration. The hydrogen radical source can be disposed in very close proximity to the EUV collector such that the outlet of the hydrogen radical source delivers the hydrogen radicals directly to the EUV collector. The outlet of the hydrogen radical source can be disposed in one or more locations around the perimeter of the EUV collector and/or near the center of the EUV collector.

Hydrogen radical source can be a single hydrogen radical source or multiple hydrogen radical sources. In one implementation, the hydrogen radical source is in the form of an annular shaped plasma vessel disposed near the perimeter of the EUV collector. In another implementation, the hydrogen radical source is in the form of multiple hydrogen radical sources disposed near the perimeter of the EUV collector and/or the center of the EUV collector.

One or more additional hydrogen radical sources can also be included within the EUV vessel. By way of example, additional hydrogen radical sources can be included near the vanes in the outlet portion of the EUV vessel so as to provide hydrogen radicals proximate to the vanes so as to convert tin deposited on the vanes to the volatile tin compounds.

Generating the hydrogen radicals within the EUV vessel ensures that sufficient numbers of hydrogen radicals are available to convert the deposited tin to the volatile tin compounds at the same time that the EUV vessel is being used to generate EUV. As a result, the EUV light source can be operated for much longer periods of time before the deposited tin interferes with the generation of the EUV. As long as sufficient numbers of hydrogen radicals can be generated, the deposited tin can be substantially eliminated and maintained at a substantially zero level so as to alleviate the need for disassembly and cleaning of the EUV vessel as a result of excess tin deposits.

FIG. 1A is a simplified schematic view of a laser-produced-plasma EUV light source 20, in accordance with embodiments of the disclosed subject matter. The LPP light source 20 includes a light pulse generation system 22 for generating a train of light pulses and delivering the light pulses into a EUV vessel 26. Each light pulse 23 travels along a beam path 21 inside a beam transport system 25 from the light pulse generation system 22. The light pulse 23 is focused into the EUV vessel 26 to illuminate and/or irradiate a selected target droplet at an irradiation region 28.

Suitable lasers for use in the light pulse generation system 22 shown in FIG. 1, may include a pulsed laser device, e.g., a pulsed gas discharge $CO_2$ laser device producing radiation at about 9.3 μm or about 10.6 μm, e.g., with DC or RF excitation, operating at relatively high power, e.g., about 10 kW or higher and high pulse repetition rate, e.g., about 10 kHz or more. In one particular implementation, the laser in the light pulse generation system 22 may be an axial-flow RF-pumped $CO_2$ laser having a MOPA configuration with multiple stages of amplification and having a seed pulse that is initiated by a Q-switched master oscillator (MO) with low energy and high repetition rate, e.g., capable of 100 kHz operation. From the MO, the laser pulse may then be amplified, shaped, and focused before reaching the irradiation region 28.

Continuously pumped $CO_2$ amplifiers may be used for the light pulse generation system 22. For example, a suitable $CO_2$ laser device having an oscillator and multiple amplifiers (e.g., O-PA1-PA2 . . . configuration) is disclosed in commonly owned U.S. Pat. No. 7,439,530, filed on Jun. 29, 2005 and issued on Oct. 21, 2008, entitled, LPP EUV LIGHT SOURCE DRIVE LASER SYSTEM, the entire contents of which are hereby incorporated by reference herein.

Alternatively, the laser in the light pulse generation system 22 may be configured as a so-called "self-targeting" laser system in which the surface of the target material in the laser waist serves as one mirror of the optical cavity. In some "self-targeting" arrangements, a master oscillator may not be required. Self-targeting laser systems are disclosed and claimed in commonly owned U.S. Pat. No. 7,491,954, filed Oct. 26, 2005 and issued Feb. 17, 2009, entitled, DRIVE LASER DELIVERY SYSTEMS FOR EUV LIGHT SOURCE, the entire contents of which are hereby incorporated by reference herein.

Depending on the application, other types of lasers may also be suitable for use in the light pulse generation system 22, e.g., an excimer or molecular fluorine laser operating at high power and high pulse repetition rate. Other examples include, a solid state laser, e.g., having a fiber, rod or disk shaped active media, a MOPA configured excimer laser system, e.g., as shown in commonly owned U.S. Pat. Nos. 6,625,191, 6,549,551, and 6,567,450, the entire contents of which are hereby incorporated by reference herein, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers, may be suitable. Other light source designs are possible.

Referring again to FIG. 1A, the EUV light source 20 may also include a target material delivery system 24, for delivering portions (e.g., droplets) of a target material into the interior of a EUV vessel 26 to the irradiation region 28, where the droplets 102A, 102B will interact with one or more light pulses 23, e.g., one or more pre-pulses and thereafter one or more irradiating pulses, to ultimately produce a plasma and a corresponding emission of EUV light 34. The unused or unirradiated droplets 102C are collected in a target material catch 200. The target material may include, but is not necessarily limited to, a material that includes tin, lithium, xenon, etc., or combinations thereof. The EUV emitting element, e.g., tin, lithium, xenon, etc., may be in the form of liquid droplets and/or solid particles contained within liquid droplets 102A, 102B or other forms as described elsewhere herein.

By way of example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in commonly owned U.S. Pat. No. 7,465,946, filed on Apr. 17, 2006 and issued Dec. 16, 2008, entitled ALTERNATIVE FUELS FOR EUV LIGHT SOURCE, the contents of which are hereby incorporated by reference herein.

Referring further to FIG. 1A, the EUV light source 20 includes a EUV collector 30. The EUV collector 30 is a near-normal incidence EUV collector having a reflective surface in the form of a prolate spheroid (i.e., an ellipse rotated about its major axis). The actual shape and geometry can of course change depending on the size of the chamber and the location of focus. The EUV collector 30 can include a graded multi-layer coating in one or more embodiments. The graded multi-layer coating can include alternating layers of molybdenum and silicon, and in some cases one or more high temperature diffusion barrier layers, smoothing layers, capping layers and/or etch stop layers.

The EUV collector 30 also includes an aperture 32. The aperture 32 allows the light pulses 23 generated by the light pulse generation system 22 to pass through to the irradiation region 28. The EUV collector 30 can be a prolate spheroid mirror that has a primary focus 31 within or near the irradiation region 28 and an intermediate focus 40. The EUV light 34 is output at or near the intermediate focus 40 from the EUV light source 20 and input to a downstream device 42 utilizing EUV light 34. By way of example, the downstream device 42 that receives the EUV light 34 can be an integrated circuit lithography tool (e.g., a scanner).

It is to be appreciated that other optics may be used in place of the prolate spheroid mirror, e.g., EUV collector 30, for collecting and directing EUV light 34 to the intermediate focus 40 for subsequent delivery to a device utilizing the EUV light. By way of example the EUV collector 30 can be a parabola rotated about its major axis. Alternatively, the EUV collector 30 can be configured to deliver a beam having a ring-shaped cross-section to the location of the intermediate focus 40 (e.g., commonly owned U.S. Pat. No. 7,843,632, filed on Aug. 16, 2006 and issued Nov. 30, 2010, entitled EUV OPTICS, the contents of which are hereby incorporated by reference).

The EUV light source 20 may also include a EUV controller 60. The EUV controller 60 can include a firing control system 65 for triggering one or more lamps and/or laser devices in the light pulse generation system 22 to thereby generate light pulses 23 for delivery into the chamber 26.

The EUV light source 20 may also include a target material position detection system including one or more target material imagers 70. The target material imagers 70 can capture images using CCD's or other imaging technologies and/or backlight stroboscopic illumination and/or light curtains that provide an output indicative of the position and/or timing of one or more target material droplets 102A, 102B relative to the irradiation region 28. The imagers 70 are coupled to and output the target material location and timing data to a target material position detection feedback system 62. The target material position detection feedback system 62 can compute a target material position and trajectory, from which a target material position error can be computed. The target material position error can be calculated on each portion of target material or an average basis (e.g., on a droplet by droplet basis or on average droplet data). The target material position error may then be provided as an input to the EUV controller 60. The EUV controller 60 can provide a position, direction and/or timing correction signal to the light pulse generation system 22 to control a source timing circuit and/or to control a beam position and shaping system to change the trajectory and/or focal power or focal point of the light pulses 23 being delivered to the irradiation region 28 in the chamber 26.

The EUV light source 20 can also include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

The EUV light source 20 can also include a target material control system 90, operable in response to a signal (which in some implementations may include the target material position error described above, or some quantity derived therefrom) from the EUV controller 60, to e.g., modify the release point of the target material from a target material dispenser 92 and/or modify target material formation timing, to correct for position errors in the target material droplets 102A, 102B arriving at the desired irradiation region 28 and/or synchronize the generation of target material droplets 102A, 102B with the light pulse generation system 22.

Additional details and alternatives of the EUV light source 20 are also described in commonly owned U.S. Pat. No. 8,575,575, filed on Mar. 16, 2010 and issued on Nov. 5, 2013 and entitled "System, Method and Apparatus for Laser Produced Plasma Extreme Ultraviolet Chamber with Hot Walls and Cold Collector Mirror", which is incorporated by reference in its entirety. U.S. Pat. No. 8,575,575 provides implementations where the EUV collector 30 and other internal surfaces such as the vanes are cooled to a temperature less than the melting point of the tin deposits formed on the surfaces of the EUV collector as in some implementations the solid form tin deposits are more easily converted to the volatile tin compounds.

Additional details and alternatives of the EUV light source 20 are also described in commonly owned U.S. Pat. No. 8,653,491, filed on Mar. 16, 2010 and issued on Feb. 18, 2014 and entitled "System, Method and Apparatus for Aligning and Synchronizing Target Material for Optimum Extreme Ultraviolet Light Output", which is incorporated by reference in its entirety. U.S. Pat. No. 8,653,491 provides implementations for more accurately targeting the target material to improve the amount of EUV emitting plasma.

Figure 1B:
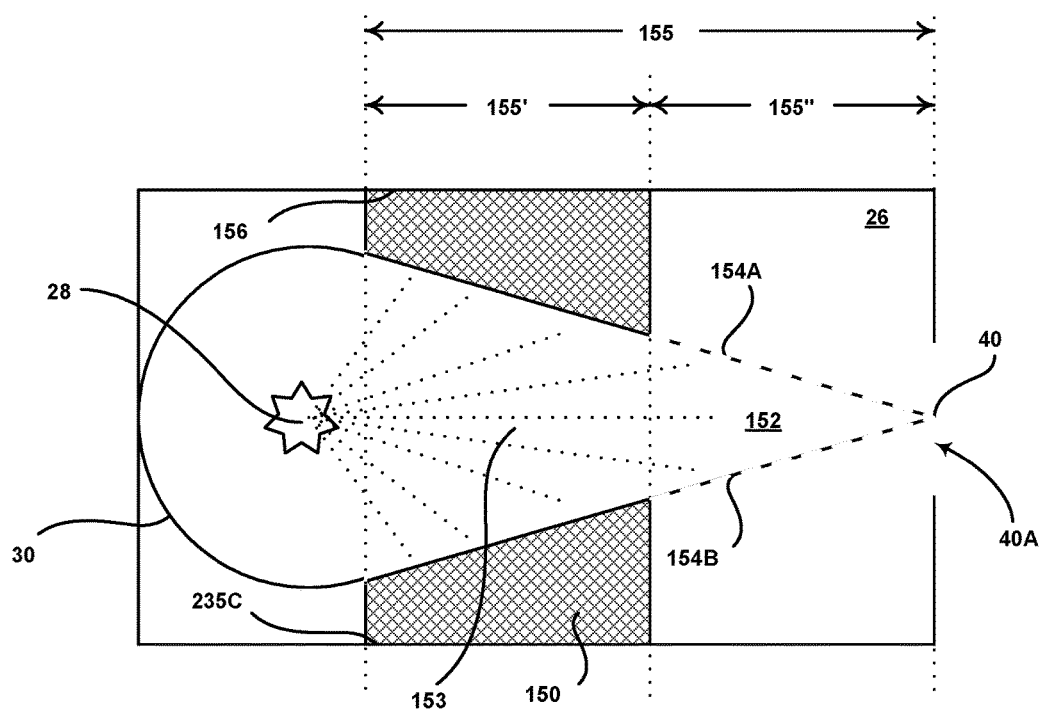
FIG. 1B illustrates a mid-vessel baffle assembly in an EUV vessel, in accordance with embodiments of the disclosed subject matter.

FIG. 1B illustrates a mid-vessel baffle assembly 150 in an EUV vessel 26, in accordance with embodiments of the disclosed subject matter. The baffle assembly 150 is located in a mid-vessel region 155' of the EUV vessel 26. The secondary region 155 of the EUV vessel 26 is divided into two portions: the mid vessel region 155' and an aft vessel region 155". The mid vessel region 155' begins at the irradiation region 28 and extends toward the outlet 40A of the EUV vessel 26. The aft vessel region 155" extends between the mid vessel region 155' and the outlet 40A of the EUV vessel 26. The mid vessel region 155' and the aft vessel region 155" have no specific length and therefore the mid vessel region 155' can include substantially all of the secondary region 155 of the EUV vessel 26, in some implementations.

The baffle assembly 150 includes a series of passages and structures that receive, slow and capture a portion of the microparticles 153 created when target material is irradiated in the irradiation region 28. The baffle assembly 150 can be formed from a series of vanes or other structures and porous materials that extend from the irradiation region 28 and the EUV collector 30 to the location of the intermediate focus 40 or any portion of the secondary region 155 of the EUV vessel 26. While the baffle assembly 150 can extend from the irradiation region 28 and the EUV collector 30 to the intermediate focus 40, the baffle assembly does not prevent or otherwise occlude the EUV light 34 from passing from the EUV collector 30 through a three dimensional, cone-shaped transmissive region 152 to the intermediate focus 40.

The passages in the baffle assembly 150 begin at the edges 154A, 154B of the transmissive region 152 and the passages in the baffle assembly 150 extend to the inner surfaces 156 of the EUV vessel 26. The baffle assembly 150 can include a series of concentric baffles surrounding but not protruding into the transmissive region 152. The baffle assembly 150 extends substantially from the edges 154A, 154B of the transmissive region 152 to the inner surfaces 156 of the EUV vessel 26.

It should be noted that while shown in a horizontal configuration, in some implementations, the EUV vessel 26 is configured and a near vertical orientation such that baffle assembly 150 and the outlet 40A of the EUV vessel are oriented substantially directly above the collector 30. As a result target material deposits forming on the baffle assembly 150 can become dislodged and be inadvertently collected on the collector 30.

Figure 1C:
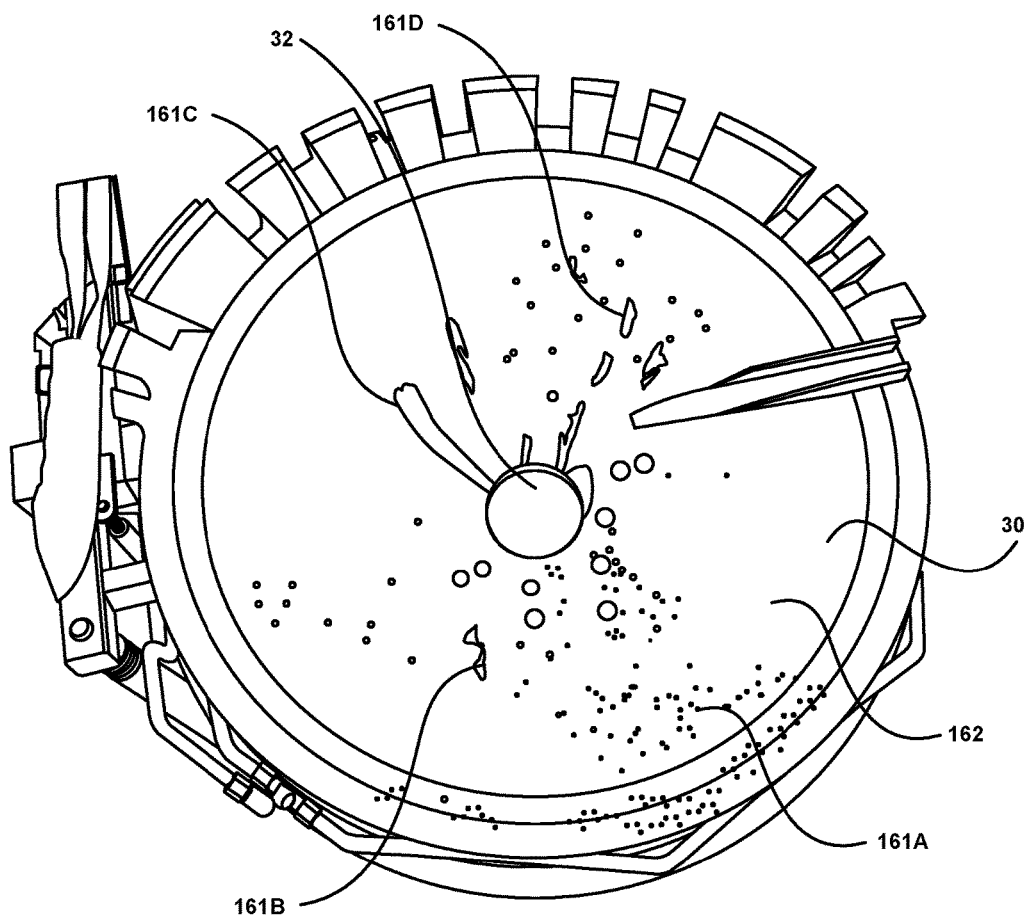
FIG. 1C is a schematic diagram of the EUV collector with target material debris deposits, in accordance with embodiments of the disclosed subject matter.

FIG. 1C is a schematic diagram of the EUV collector 30 with target material debris deposits 161A-D and 162, in accordance with embodiments of the disclosed subject matter. The target material debris deposits 161A-D and 162 can be present in many forms. By way of example, relatively small particulates 161A, can deposit on the surface of the collector 30 that are discernible by the naked eye. Larger deposits 161B, 161D can include multiple small particulates that coagulate or otherwise accumulate and/or aggregate into larger deposits and/or target material debris deposits that initially formed on the baffle assembly 150 and were released from the baffle assembly and subsequently deposited on the collector 30. Even larger target material debris deposits 161C can also form for various reasons on the collector 30. In addition to the called out target material debris deposits 161A-D, a very fine layer of target material debris deposits 162 can coat substantially the entire surface of the collector 30 and other surfaces internal to the EUV vessel 26. The very fine layer of target material debris deposits 162 can be made up of substantial microscopic target material debris such as might resemble a substantially uniform coating of dust on the surface of the collector 30.

Figure 1D:
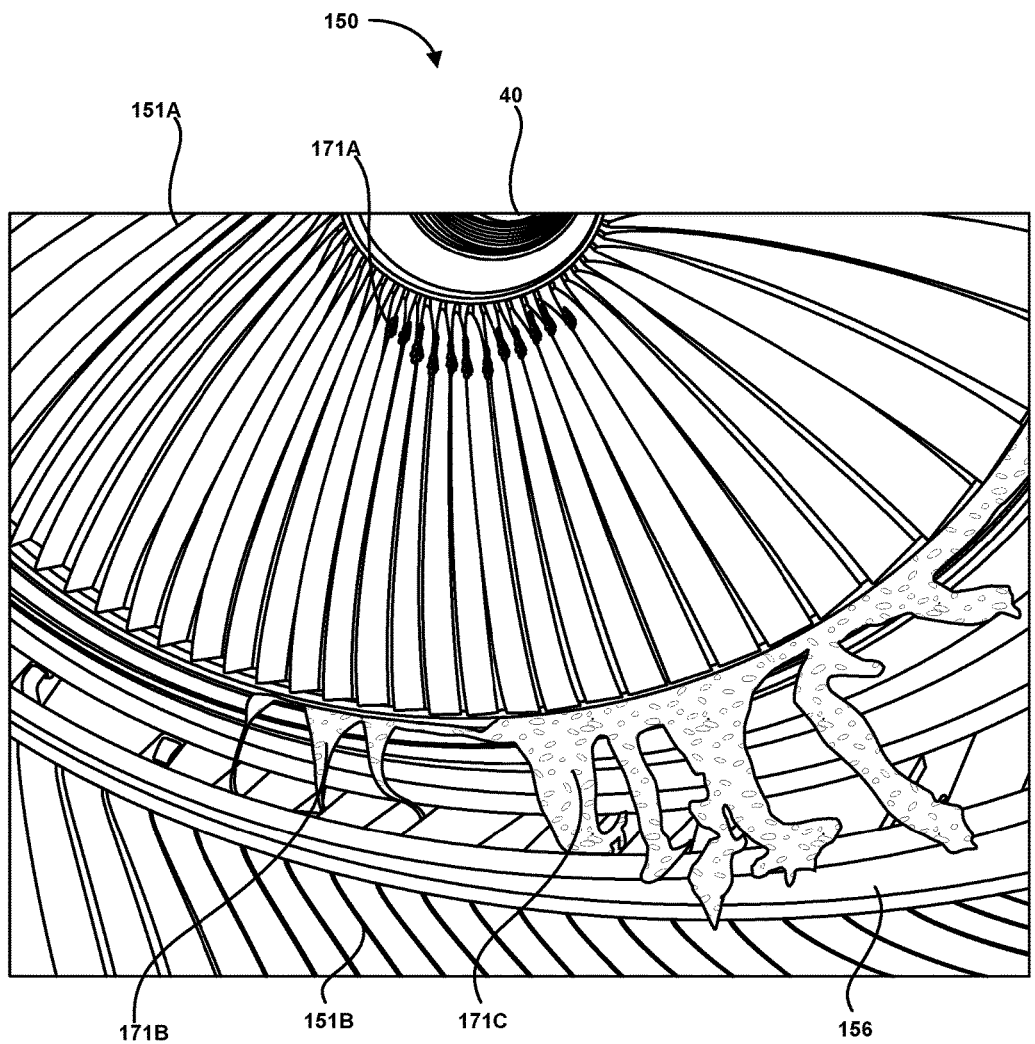
FIG. 1D is a schematic diagram of a portion of the baffle assembly, in accordance with embodiments of the disclosed subject matter.

FIG. 1D is a schematic diagram of a portion of the baffle assembly 150, in accordance with embodiments of the disclosed subject matter. The baffle assembly 150 includes many separate vanes 151A, 151B. The vanes 151A, 151B are separated from one another by varying distances as illustrated. Further the vanes are formed at varying angles as illustrated by the differences between vanes 151A and vanes 151B. Target material debris deposits 171A-171C can form at various locations on the many separate vanes 151A, 151B. By way of example, target material deposits 171A can form near the region of the intermediate focus 40 of the EUV vessel 26. Similarly, target material debris deposits 171B and 171C can form along the outer edges of the vanes 151A, 151B, somewhat closer to the inner surfaces 156 of the EUV vessel 26. As noted above the target material debris deposits 171A-171C can form initially on the baffle assembly 150 and then for various reasons become dislodged from the baffle assembly and be collected on the surface of the collector 30.

The various target material debris deposits 161A-161D, 171A-171C ultimately interfere in various ways with the performance of the EUV vessel 26 and must be removed at some point. One approach to removing the target material debris deposits is to interrupt the generation of EUV and disassemble the EUV vessel 26 to clean each of the individual parts of the EUV vessel such as the collector 30, the baffle assembly 150 and other inner surfaces 156. However, interrupting the generation of the EUV in the EUV vessel 26 also results in interruptions to the EUV lithography process that is consuming the EUV generated in the EUV vessel, effectively ceasing production. A more effective EUV vessel cleaning process is needed. Various forms of in situ hydrogen radical generation provides a much more effective and timely cleaning process for removing the various target material to pre-deposits 161A-161D, 171A-171C from the EUV vessel 26, without interrupting generation of the EUV light in the EUV vessel.

Figure 2:
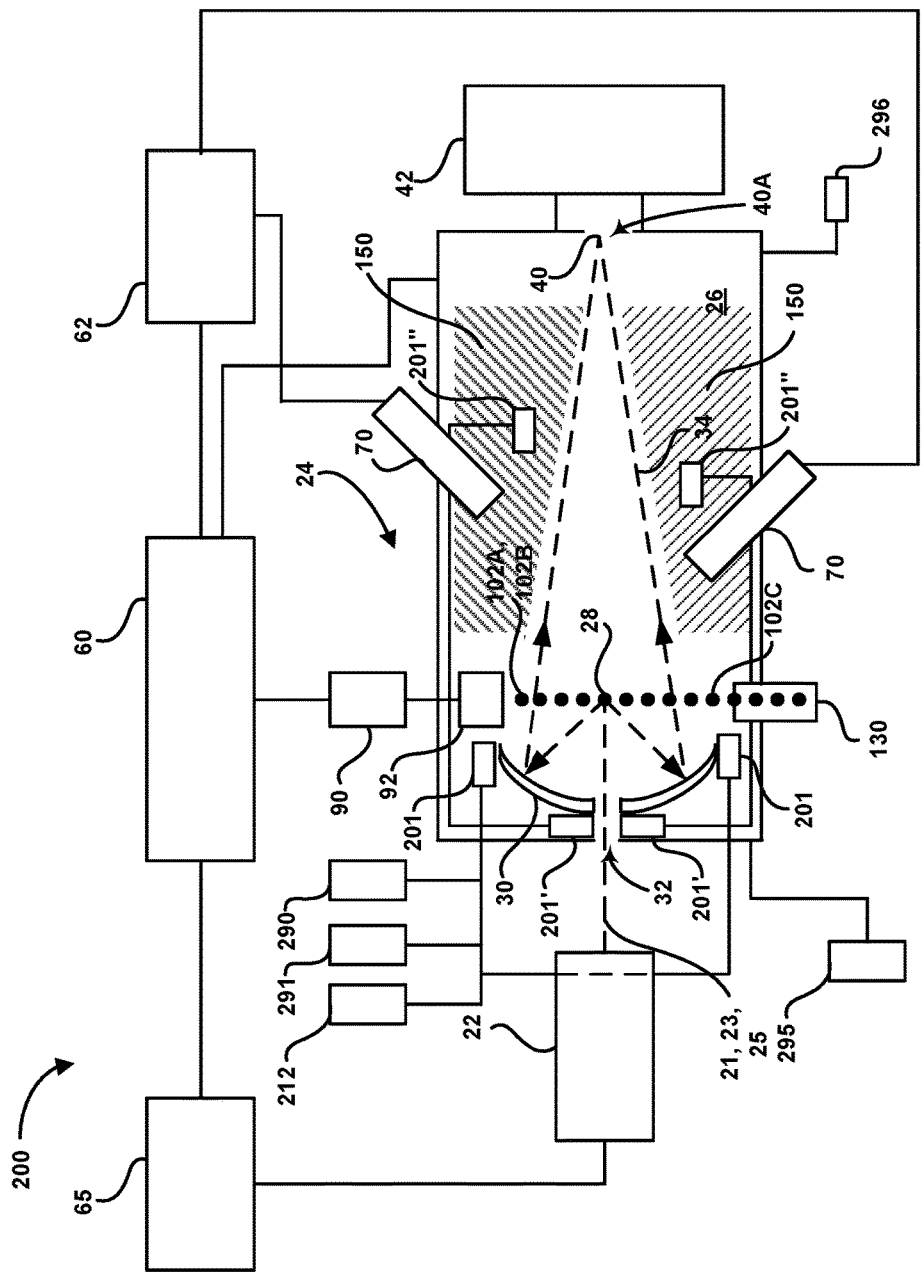
FIG. 2 is a simplified schematic view of an EUV light source including one or more in situ hydrogen radical sources, in accordance with embodiments of the disclosed subject matter.

FIG. 2 is a simplified schematic view of an EUV light source 200 including one or more in situ hydrogen radical sources 201, 201', 201", in accordance with embodiments of the disclosed subject matter. The EUV light source 200 includes one or more in situ hydrogen radical sources 201, 201', 201" that can be placed in one or more locations within the EUV vessel 26. In situ hydrogen radical sources 201 are placed near the perimeter of the collector 30. Central in situ hydrogen radical sources 201' are placed near the center aperture 32 of the collector 30. Baffle in situ hydrogen radical sources 201" are placed near the baffle assemblies of the EUV vessel 26. It should be noted that the EUV vessel 26 can include as few as one of the in situ hydrogen radical sources 201, 201', 201" and as many as can be physically placed within the EUV vessel. The in situ hydrogen radical sources 201, 201', 201" can be one or more of the different types and configurations of in situ hydrogen radical sources as will be described in more detail below.

A hydrogen gas source 290 is coupled to each of the in situ hydrogen radical sources 201, 201', 201". A carrier gas source 291 can optionally be coupled to each of the in situ hydrogen radical sources 201, 201', 201". As will be described in more detail below a signal source 212 or sources can be coupled to each of the in situ hydrogen radical sources 201, 201', 201". It should be noted that the in situ hydrogen radical sources 201, 201', 201" can be placed in substantially symmetrical positions or asymmetrical positions within the EUV vessel 26.

Figure 3A:
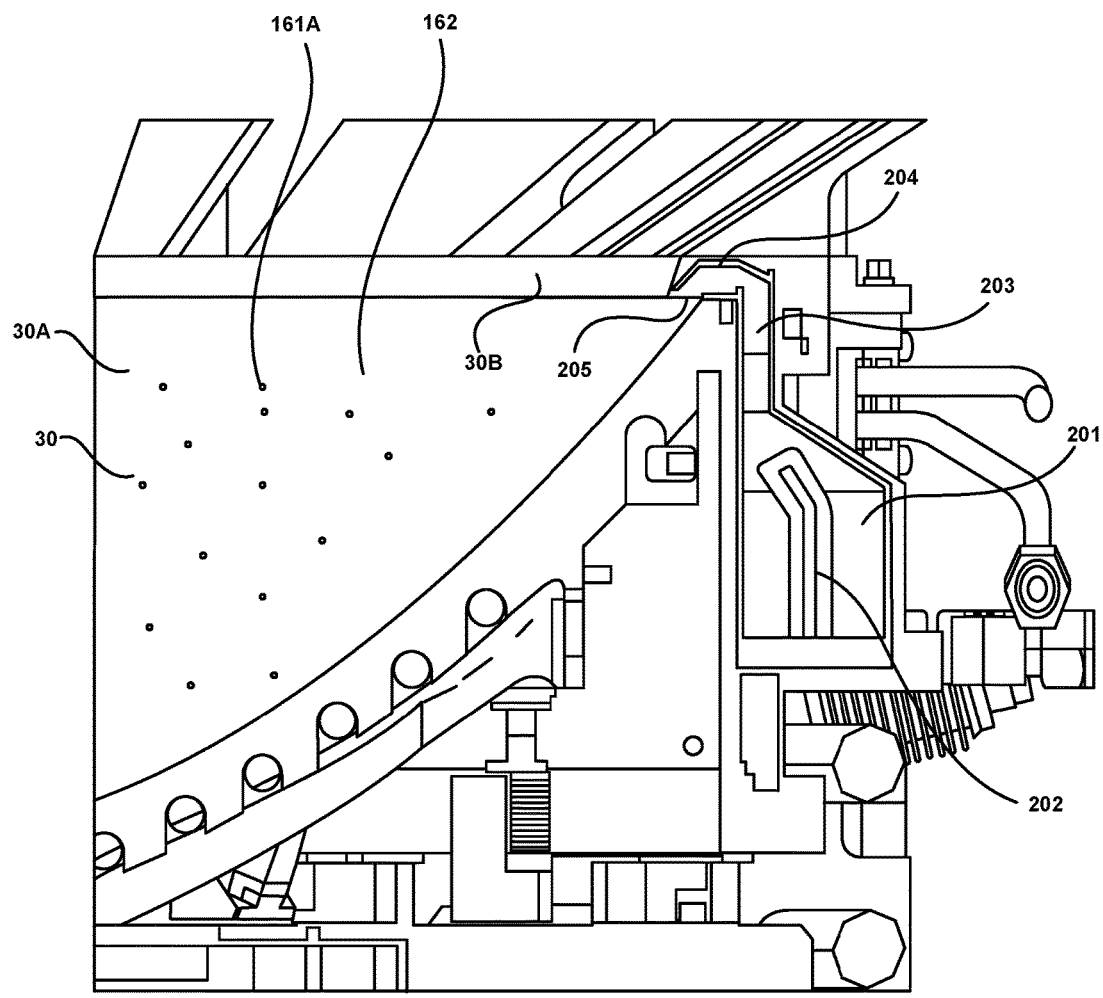
FIG. 3A is a detailed cross-sectional view of a portion of the collector and an in situ hydrogen radical source, in accordance with embodiments of the disclosed subject matter.
Figure 3B:
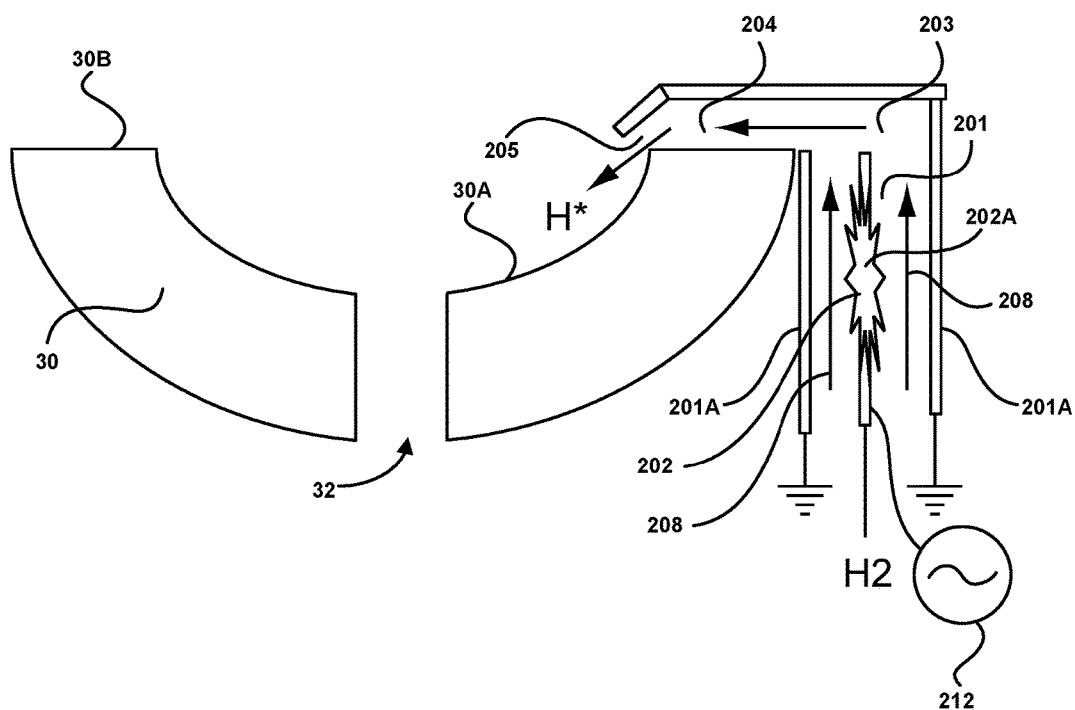
FIG. 3B is a simplified schematic of a cross-sectional view of the collector and the in situ hydrogen radical source, in accordance with embodiments of the disclosed subject matter.

FIG. 3A is a detailed cross-sectional view of a portion of the collector 30 and an in situ hydrogen radical source 201, in accordance with embodiments of the disclosed subject matter. FIG. 3B is a simplified schematic of a cross-sectional view of the collector 30 and the in situ hydrogen radical source 201, in accordance with embodiments of the disclosed subject matter. The collector 30 has a collector surface 30A and a collector rim 30B. The collector 30 also includes a central aperture 32. The hydrogen radical source 201 is disposed adjacent to the collector 30. In the shown embodiment, the hydrogen radical source 201 is disposed immediately adjacent to the rim 30B of the collector 30.

The hydrogen radical source 201 includes a radical generator 202, an outlet channel 203 that leads to an over the rim channel 204 and an outlet 205. The radical generator 202 is coupled to a signal source 212. The hydrogen radical source 201 is coupled to a hydrogen source that is not shown. The hydrogen source can be a source of hydrogen gas or other hydrogen containing source material such as a hydrogen containing gas or a mixture of hydrogen containing gases. The hydrogen source can also include a mixing apparatus for mixing the hydrogen containing gases with an inert carrier gas 208 such as argon, helium, nitrogen, and other substantially inert get carrier gases. In another implementation, the inert carrier gas 208 can be injected directly into the hydrogen radical source 201.

Hydrogen radicals H*, including H+ and/or H− ions are created by injecting hydrogen into the hydrogen radical source 201 and energizing the radical generator 202. The hydrogen radicals then flow through the outlet channel 203 through the over the rim channel 204 and out the outlet 205 which is proximate to the surface 30A of the collector 30. The inert carrier gas can be used to transport the hydrogen radicals from the hydrogen radical source 201 to the surface 30A of the collector 30. The hydrogen radicals can then react with the target material debris deposits 171A, 162 disposed on the surface 30A of the collector 30 to create the volatile tin compounds. The volatile tin compounds can then be purged from the EUV vessel 26 through the purge outlet 296 (shown in FIG. 2) using a purge gas source 295 (shown in FIG. 2).

Referring to FIG. 3B, the hydrogen radical source 201 can be a capacitively coupled hydrogen plasma chamber having walls 201A coupled to a first potential and the radical generator 202 coupled to a second potential. As shown, the walls 201A are grounded and the radical generator 202 is coupled to a signal source 210. However it should be understood that the walls 201A could be coupled to the signal source 212 and the radical generator 202 could be grounded or coupled to a second signal source. In one implementation the signal source 212 can be an RF signal source having a frequency in the range of 10s of kHz to about 10 GHz. The signal source 212 can excite the hydrogen present in the hydrogen radical source 201 to generate a hydrogen plasma 202A that dissociates the hydrogen into the hydrogen radicals H*.

Figure 4:
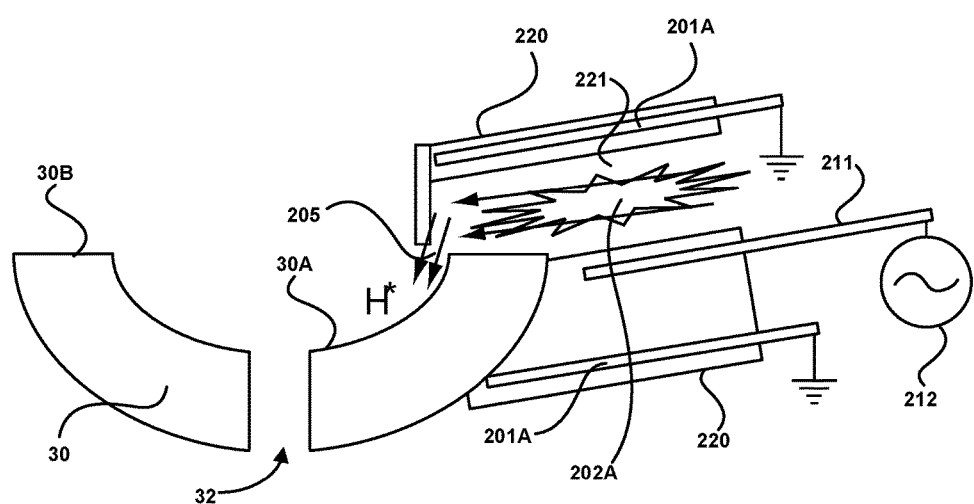
FIG. 4 is a simplified schematic of a cross-sectional view of the collector and an alternative, in situ hydrogen radical source, in accordance with embodiments of the disclosed subject matter.

FIG. 4 is a simplified schematic of a cross-sectional view of the collector 30 and an alternative, in situ hydrogen radical source 221, in accordance with embodiments of the disclosed subject matter. The alternative, in situ hydrogen radical source 221 is somewhat similar to in situ hydrogen radical source 201, however includes a ceramic insulator 220 to isolate the walls 201A and the radical generator 211 of the alternative, in situ hydrogen radical source 221 from the plasma 202A generated therein.

Figure 5:
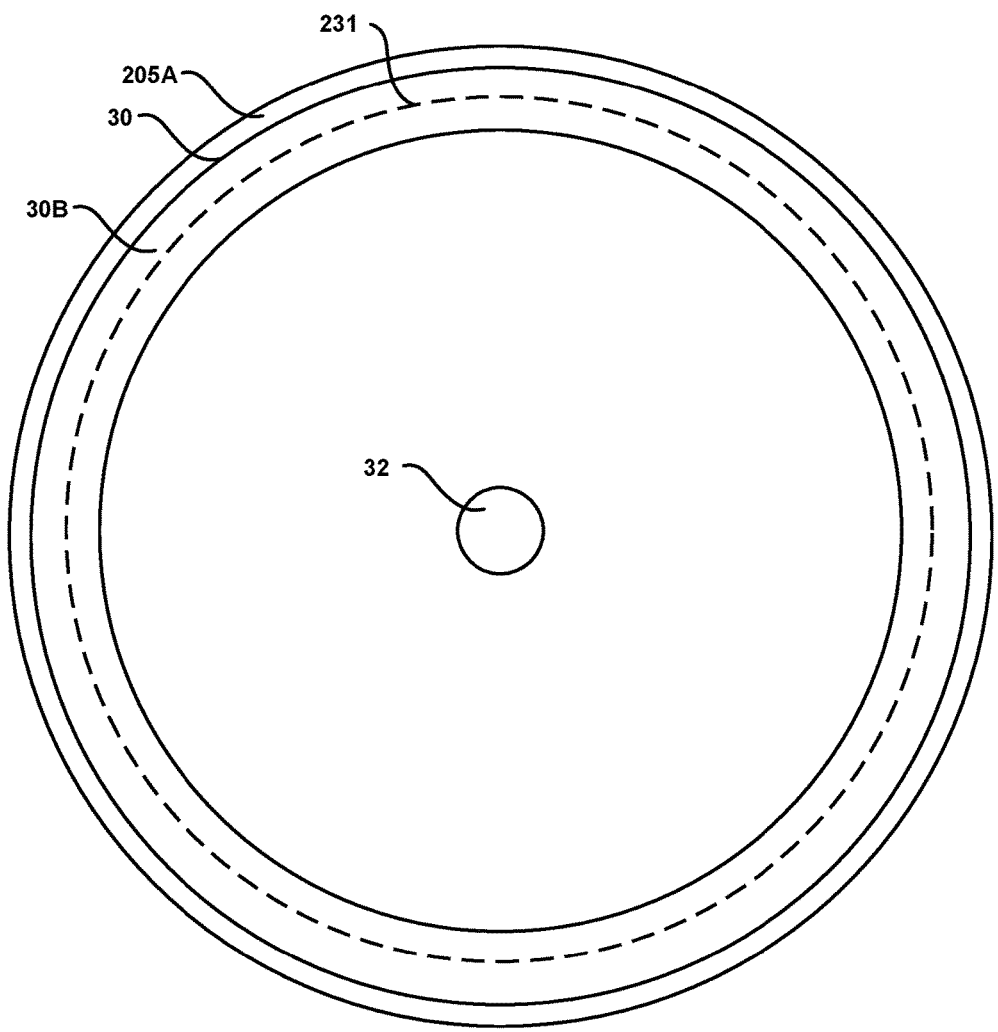
FIG. 5 is a simplified view of the collector having an in situ hydrogen radical source substantially surrounding the perimeter of the collector, in accordance with embodiments of the disclosed subject matter.

FIG. 5 is a simplified view of the collector 30 having an in situ hydrogen radical source 231 substantially surrounding the perimeter of the collector, in accordance with embodiments of the disclosed subject matter. The in situ hydrogen radical source 231 is an annular chamber disposed around the perimeter of the collector 30. The in situ hydrogen radical source 231 has a cross-section substantially similar to in situ hydrogen radical sources 201 or 221, as described above. The in situ hydrogen radical source 231 has an outlet 205A around the perimeter of the collector 30 such that hydrogen radicals H* are generated and output substantially evenly around the perimeter of the collector.

Figure 6:
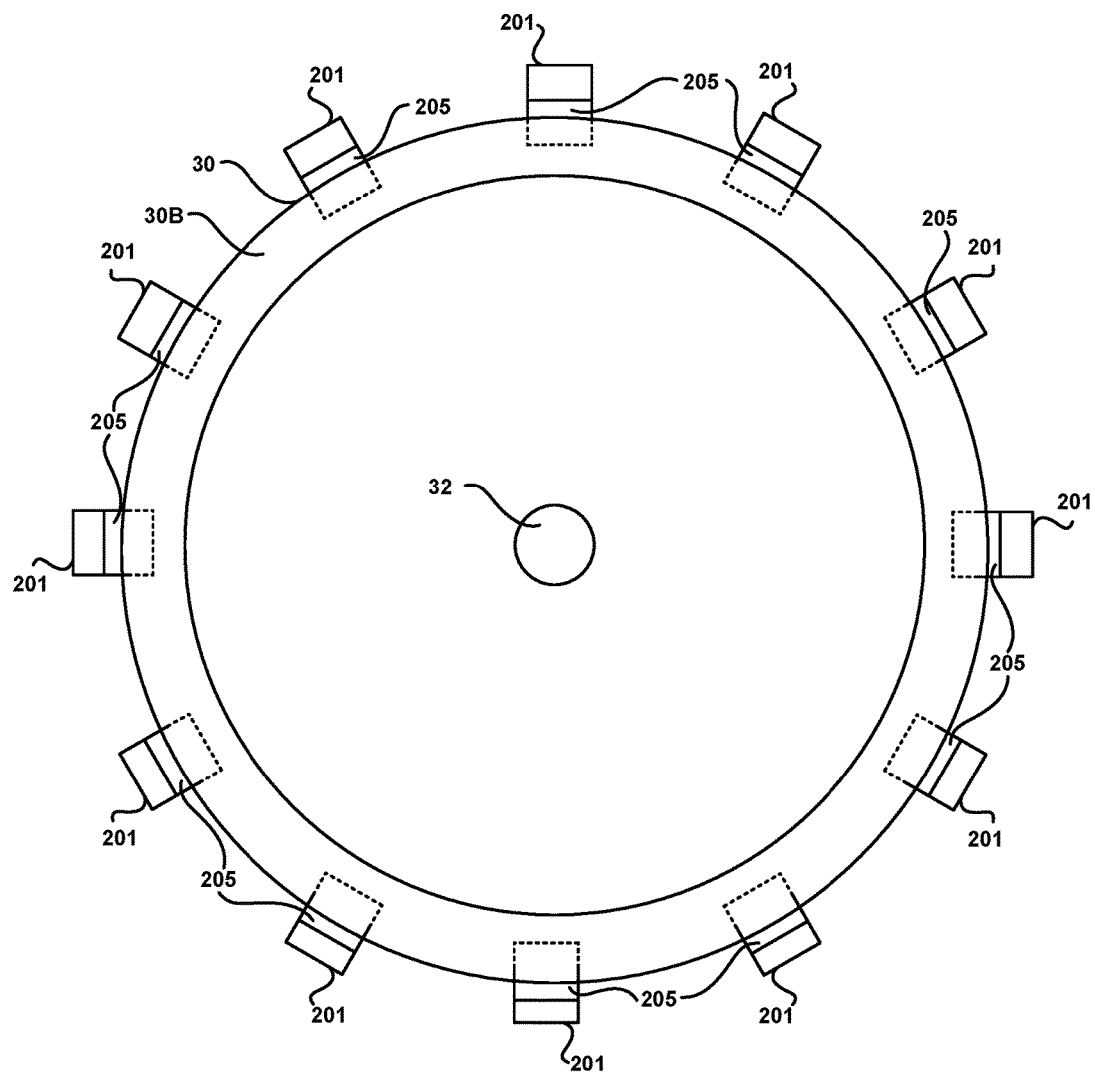
FIG. 6 is a simplified view of the collector having multiple in situ hydrogen radical sources substantially evenly distributed and disposed around the perimeter of the collector, in accordance with embodiments of the disclosed subject matter.

FIG. 6 is a simplified view of the collector 30 having multiple in situ hydrogen radical sources 201 substantially evenly distributed and disposed around the perimeter of the collector, in accordance with embodiments of the disclosed subject matter. Each of the in situ hydrogen radical sources 201 include an outlet 205 such that the hydrogen radicals H* generated by each of the hydrogen radical sources are output around the perimeter of the collector 30. Each of the in situ hydrogen radical sources 201 can be any one or more of the in situ hydrogen radical sources described herein. In one implementation each of the hydrogen radical sources 201 that are distributed around the perimeter of the collector 30 are the same type of hydrogen radical source. In another implementation the hydrogen radical sources distributed around the perimeter of the collector 30 include one or more types of hydrogen radical sources.

Figure 7:
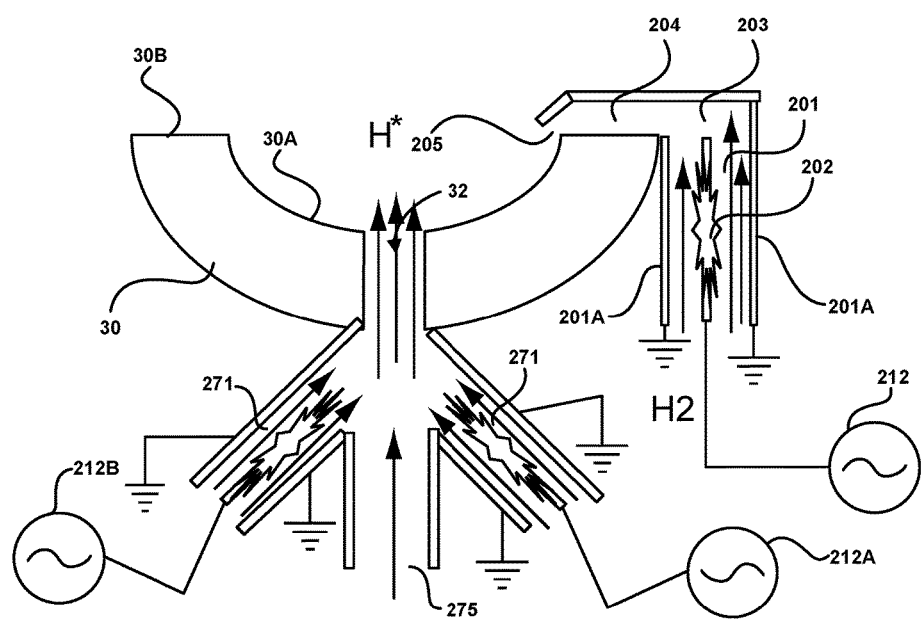
FIG. 7 is a simplified schematic of a cross-sectional view of the collector and multiple in situ hydrogen radical sources, in accordance with embodiments of the disclosed subject matter.

FIG. 7 is a simplified schematic of a cross-sectional view of the collector 30 and multiple in situ hydrogen radical sources 201, in accordance with embodiments of the disclosed subject matter. One or more of the multiple in situ hydrogen radical sources 201 are disposed around the perimeter and along the edge 30B of the collector 30. In addition to the in situ hydrogen radical sources 201 disposed around the perimeter of the collector 30, one or more central in situ hydrogen radical sources 271 are disposed proximate to the center aperture 32 such that hydrogen radicals H* generated therein are output through the center aperture of the collector. The hydrogen radicals H* generated in central in situ hydrogen radical sources 271 provide hydrogen radicals proximate to the target material debris deposited on the collector 30 and near the center aperture 32. It should be noted that the central in situ hydrogen radical sources 271 are shown to resemble hydrogen radical source 201 described above, however each of the central in situ hydrogen radical sources 271 can be any sort of hydrogen radical source described herein.

Each of the central in situ hydrogen radical sources 271 has a respective signal source 212A and 212B and the in situ hydrogen radical source 201 has a respective signal source 212. The respective signal sources 212, 212A, 212B can be the same or different signal sources having the same or different frequencies, powers, duty cycles, or amplitudes so that each of the in situ hydrogen radical sources 201, 271 can be individually controlled to produce the quantity of hydrogen radicals as may be needed for each local surface area having target material debris deposited thereon. By way of example, if the area of the surface of the collector 30 proximate to the aperture 32 has a large quantity of target material debris deposited thereon, and the area near the perimeter of the collector has relatively small quantity of target material to debris deposited thereon, then the quantity of hydrogen radicals H* needed near the aperture would be greater than the quantity of hydrogen radicals H* needed near the perimeter to remove the respective amounts of target material debris local to each of the outlets of the in situ hydrogen radical sources 201, 271.

Figure 8:
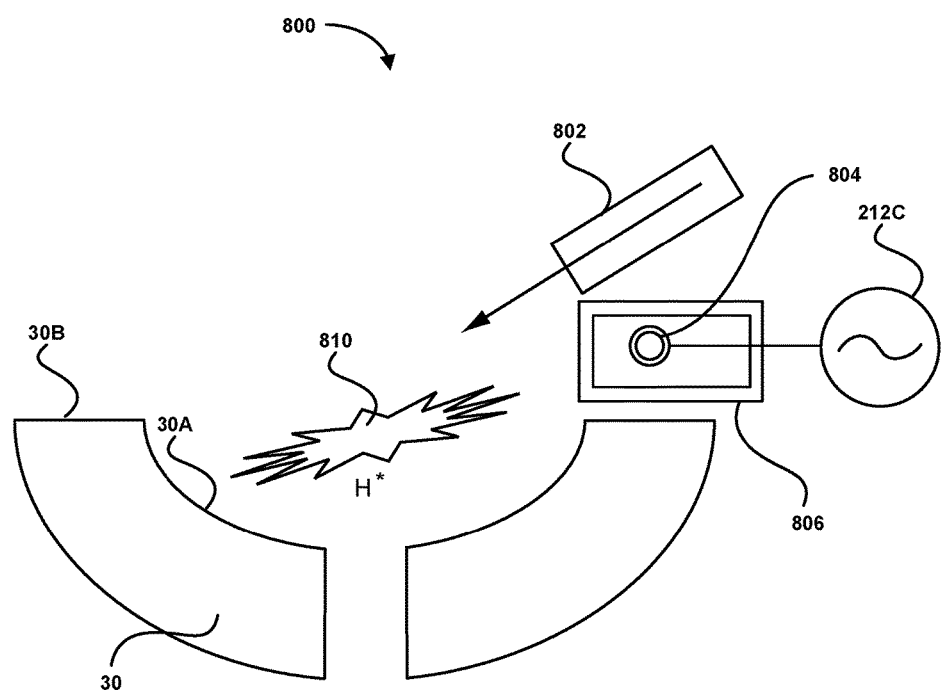
FIG. 8 is a simplified schematic side view of an inductive hydrogen radical generator, in accordance with embodiments of the disclosed subject matter.
Figure 9:
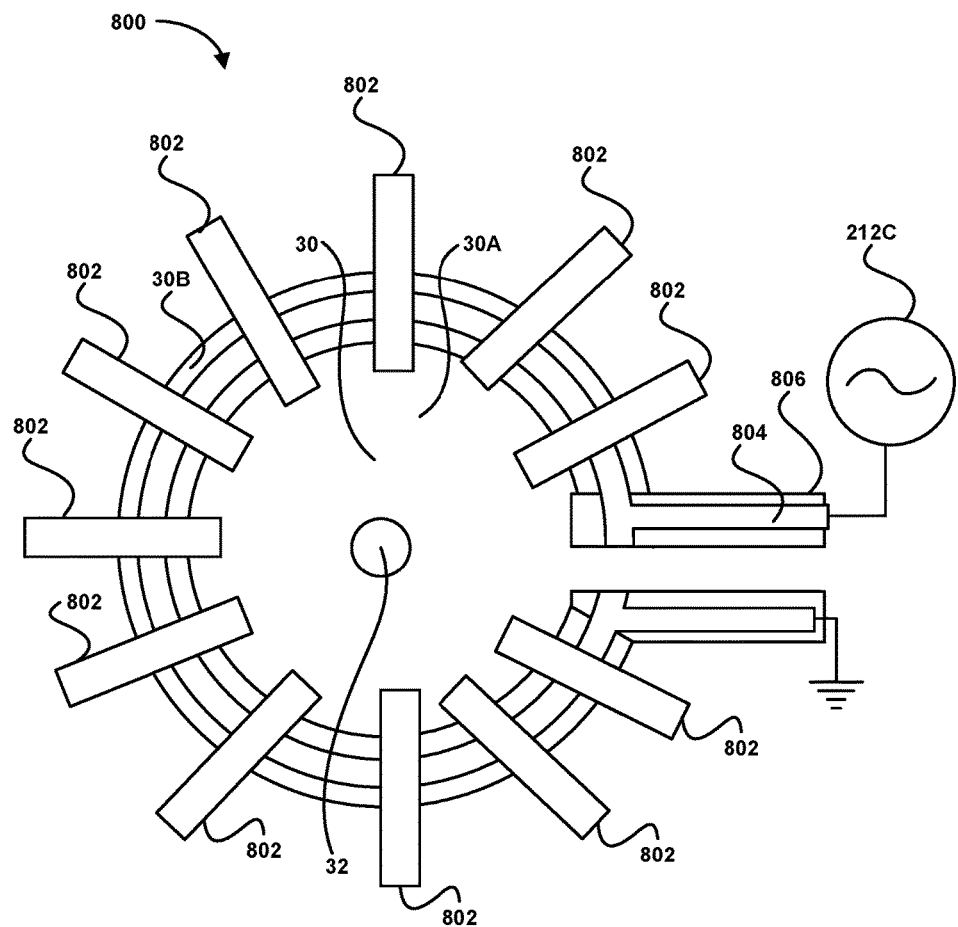
FIG. 9 is a simplified schematic top view of the inductive hydrogen radical generator, in accordance with embodiments of the disclosed subject matter.

FIG. 8 is a simplified schematic side view of an inductive hydrogen radical generator 800, in accordance with embodiments of the disclosed subject matter. FIG. 9 is a simplified schematic top view of the inductive hydrogen radical generator 800, in accordance with embodiments of the disclosed subject matter. The inductive hydrogen radical generator 800 includes multiple hydrogen nozzles 802 disposed around the perimeter of the collector 30. An inductive coil 804 is disposed between the hydrogen nozzles and the rim 30B of the collector 30.

The inductive coil 804 has a first end coupled to a signal source 212C. The inductive coil 804 has a second end coupled to ground. It should be noted that the inductive coil 804 is shown making only one substantial loop around the perimeter of the collector 30, however this is shown to simplify the description of the inductive coil and that the inductive coil can include one or more loops around the perimeter of the collector.

The signal source 212C outputs and induction signal of suitable frequency amplitude and duty cycle. As the induction signal passes through the induction coil 804, a magnetic field is induced into the center of the coil as shown in FIG. 9. The hydrogen nozzles 802 to inject hydrogen into the center of the coil and a hydrogen plasma 810 can be created. The hydrogen plasma generates the hydrogen radicals H*proximate to the surface 30A of the collector 30 where the hydrogen radicals H* can interact with any target material deposits that may be present.

Figure 10:
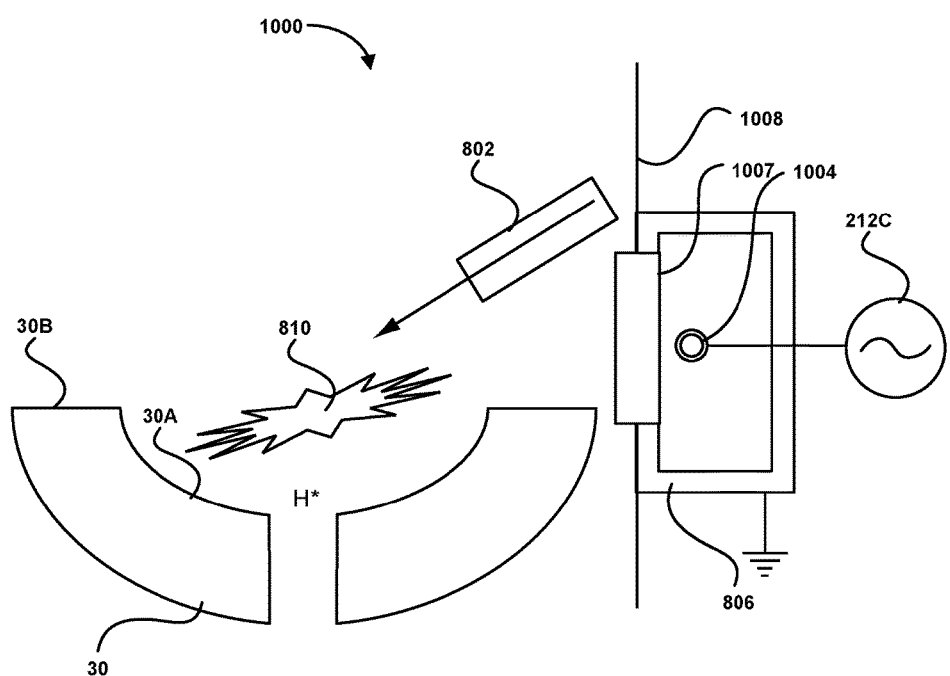
FIG. 10 is a simplified schematic side view of an inductive hydrogen radical generator, in accordance with embodiments of the disclosed subject matter.

FIG. 10 is a simplified schematic side view of an inductive hydrogen radical generator 1000, in accordance with embodiments of the disclosed subject matter. The inductive hydrogen radical generator 1000 differs from the inductive hydrogen radical generator 800 described above in FIGS. 8 and 9 in that the induction coil 1004 is disposed external to a sidewall 1008 of the EUV vessel 26. The sidewall 1008 includes a ceramic window 1007 through which the induction coil can induce the magnetic field over the surface 30A of the collector 30. As described above the hydrogen nozzles 802 inject hydrogen into the magnetic field generated by the induction coil 1004 to create a hydrogen plasma 810 that produces the needed hydrogen radicals H*.

Figure 11:
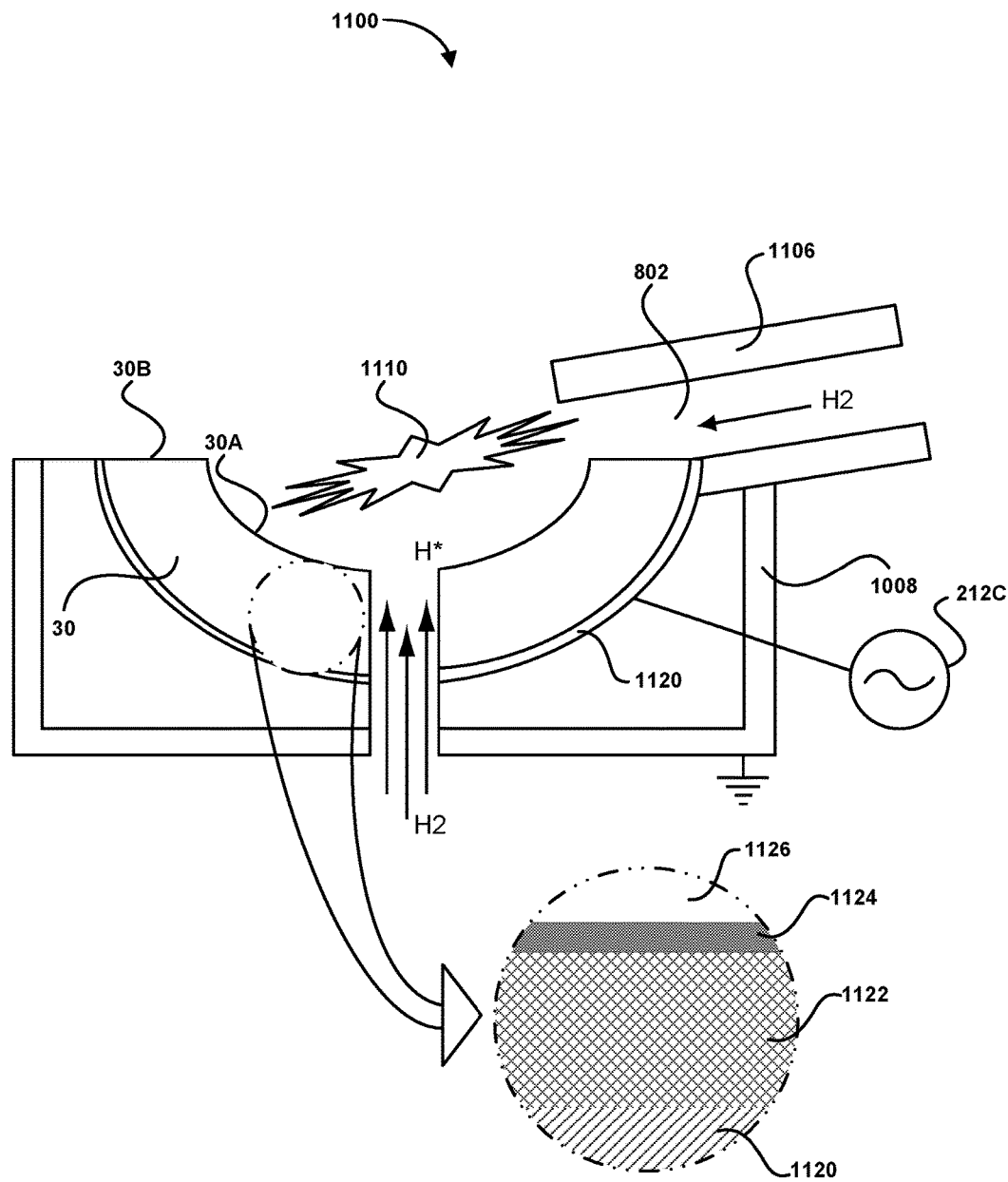
FIG. 11 is a simplified schematic side view of a capacitive hydrogen radical generator, in accordance with embodiments of the disclosed subject matter.

FIG. 11 is a simplified schematic side view of a capacitive hydrogen radical generator 1100, in accordance with embodiments of the disclosed subject matter. The capacitive hydrogen radical generator 1100 utilizes the conductive layer 1120 of the collector 30 as a first electrode and the walls 1008 of the EUV vessel 26 as the second electrode. The collector 30 includes multiple layers 1120, 1122, 1124, and 1126. One of the layers is a conductive layer 1120. The conductive layer 1120 can be formed from any suitable conductive material including copper, aluminum, steel, stainless steel and combinations and alloys containing copper, aluminum, steel, stainless steel. The conductive layer 1120 can also include heating and cooling devices and subsystems for managing the temperature of the collector 30. In one implementation the conductive layer 1120 includes resistive heaters and/or cooling channels for passing a cooling fluid such as a gas or liquid coolant. The conductive layer 1120 can also provide physical structural support and mounting points for the collector 30.

A silicon, glass or quartz layer 1122 is supported by the conductive layer 1120. A reflective layer 1124 is supported on the silicon, glass or quartz layer 1122. The reflective layer 1124 performs the reflective function of the collector 30. An optional protective layer 1126 can be formed on top of the reflective layer 1124. Should be understood that the thicknesses of the different layers 1120, 1122, 1124 and 1126 are not accurately shown in the detailed view of FIG. 11.

In operation, applying a signal from signal source 212C to the conductive layer 1120 capacitively couples the signal into the hydrogen gas injected from the hydrogen nozzle 1106 to create a hydrogen plasma 1110 that generates the hydrogen radicals H* near the surface 30A of the collector 30.

Figure 12:
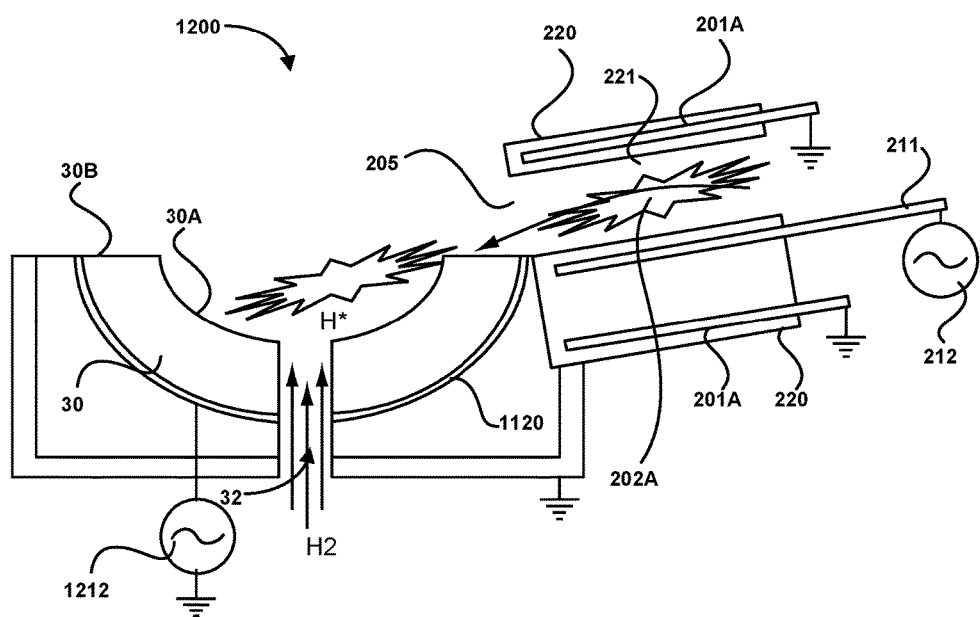
FIG. 12 is a simplified schematic side view of a capacitive hydrogen radical generator, in accordance with embodiments of the disclosed subject matter.

FIG. 12 is a simplified schematic side view of a capacitive hydrogen radical generator 1200, in accordance with embodiments of the disclosed subject matter. The hydrogen radical source 221 can be a capacitively coupled hydrogen plasma chamber having walls 201A coupled to a first potential and the radical generator 211 coupled to a second potential. As shown, the walls 201A are grounded and the radical generator 202 is coupled to a signal source 212. However it should be understood that the walls 201A could be coupled to the signal source 212 and the radical generator 211 could be grounded or coupled to a second signal source (not shown). In one implementation the signal source 212 can be an RF signal source having a frequency in the range of 10s of kHz to about 10 GHz. The signal source 212 can excite the hydrogen present in the hydrogen radical source 221 to generate a hydrogen plasma 202A that dissociates the hydrogen into the hydrogen radicals H*.

The capacitive hydrogen radical generator 1200 also utilizes the conductive layer 1120 of the collector 30 as a third electrode that is coupled to second signal source 1212. The second signal source 1212 can produce a signal ranging from DC (0 Hz) to as much as 10s of MHz. In one implementation the second signal source 1212 outputs a signal from between 0 Hz to about 13 MHz. The second signal source 1212 can be used to pull the hydrogen radicals H* toward the surface 30A of the collector 30 and thereby increase the concentration of the hydrogen radicals H* near the surface 30A and the target material debris deposits thereon. Increasing the concentration of the hydrogen radicals H* near the surface 30A increases the conversion of the tin in the target material debris deposits to volatile tin compounds such as SnH4.

Figure 13:
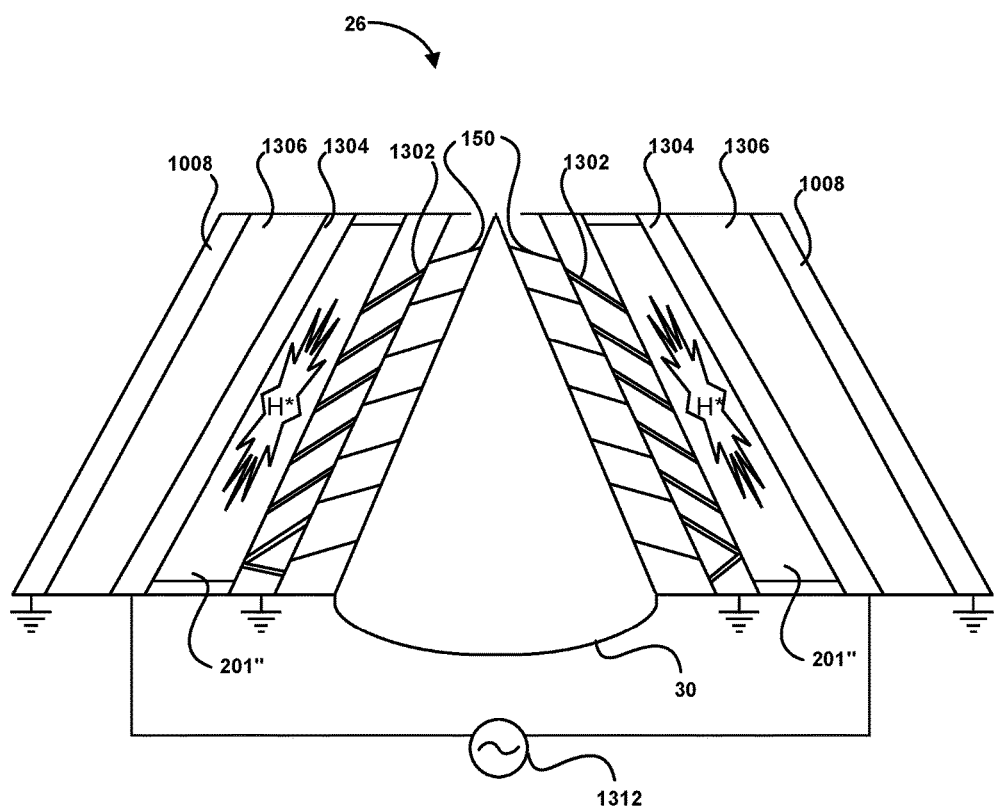
FIG. 13 is a simplified schematic side view of the EUV vessel including capacitive hydrogen radical sources disposed in or near the baffles, in accordance with embodiments of the disclosed subject matter.

FIG. 13 is a simplified schematic side view of the EUV vessel 26 including capacitive hydrogen radical sources 201" disposed in or near the baffles 150, in accordance with embodiments of the disclosed subject matter. The hydrogen radical sources 201" include a first electrode 1302 and a second electrode 1304. The first electrode 1302 is grounded, in some implementations. The second electrode 1304 is coupled to a signal source 1312, in some implementations. Alternatively, the first electrode 1302 can be coupled to the signal source 1312 and the second electrode 1304 coupled to ground. Alternatively, in lieu of coupling one of the electrodes 1302, 1304 to ground, that electrode could be coupled to a second signal source, not shown. The second electrode 1304 can be insulated from the side wall 1008 of the EUV vessel 26 by an optional insulating layer 1306.

Injecting hydrogen into the hydrogen radical sources 201" and applying appropriate signals to the electrodes 1302, 1304, generates the hydrogen radicals H* proximate to the baffles 150. The hydrogen radicals H* can then react with the target material debris deposits on the baffles 150 to produce a volatile byproduct that can be evacuated or purged from the EUV vessel 26.

Figure 14:
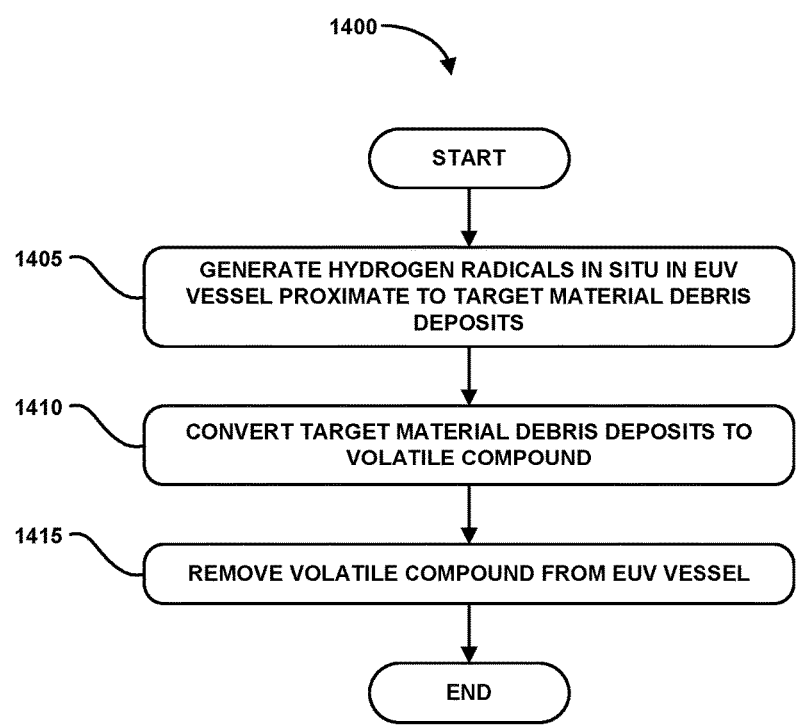
FIG. 14 is a flowchart diagram that illustrates the method operations performed in generating hydrogen radicals in situ in the EUV vessel, in accordance with embodiments of the disclosed subject matter.

FIG. 14 is a flowchart diagram that illustrates the method operations 1400 performed in generating hydrogen radicals in situ in the EUV vessel 26, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 1400 will now be described.

In an operation 1405, hydrogen radicals are generated in situ in the EUV vessel proximate to target material debris deposits. Hydrogen radicals H* are generated by the various hydrogen radical sources described above. Several different hydrogen radical sources have been described above and more than one hydrogen radical sources can be included within the EUV vessel 26, however the hydrogen radical sources can be selectively activated to remove certain target material debris deposits that are proximate to the activated hydrogen radical source or sources. It should be noted that each of the hydrogen radical sources can be operated independently and at different operating parameters to produce varying quantities of hydrogen radicals H*.

In operation 1410, the hydrogen radicals H* combine with the target material debris deposits to convert the target material debris deposits to a volatile compound. In an operation 1415, the volatile compound is removed from the EUV vessel 26. The volatile compound can be removed the EUV vessel 26 by purging or by evacuating the volatile compound. It should be noted that operations 1405 through 1415 can be conducted while the EUV vessel 26 is also producing EUV.

In one implementation, the in situ cleaning process includes generating and injecting hydrogen radicals near the aperture 32 at a flow rate of about 90 slm and generating and injecting hydrogen radicals near the perimeter of the EUV collector 30 at a flow rate of about 90 slm while maintaining the pressure at about 1.3 Torr and the signal sources 212, 212A, 212B, 212C, 1212 providing a signal of between about several kHz to 100s of MHz RF at a power of between about 1 kW to several kW depending on the desired cleaning rate. It should be understood that these are merely example flow rates, RF frequency and RF power and that lesser or greater flow rates, RF frequencies and RF powers and combinations thereof can be utilized. It should also be understood that the hydrogen radical generation and injection can be a different flow rate, RF frequency, and RF power in one or more of the local portions of the perimeter of the EUV collector 30 and the aperture 32 as may be needed to address additional target material debris proximate to the respective outlets of each of the hydrogen radical sources.

Figure 15:
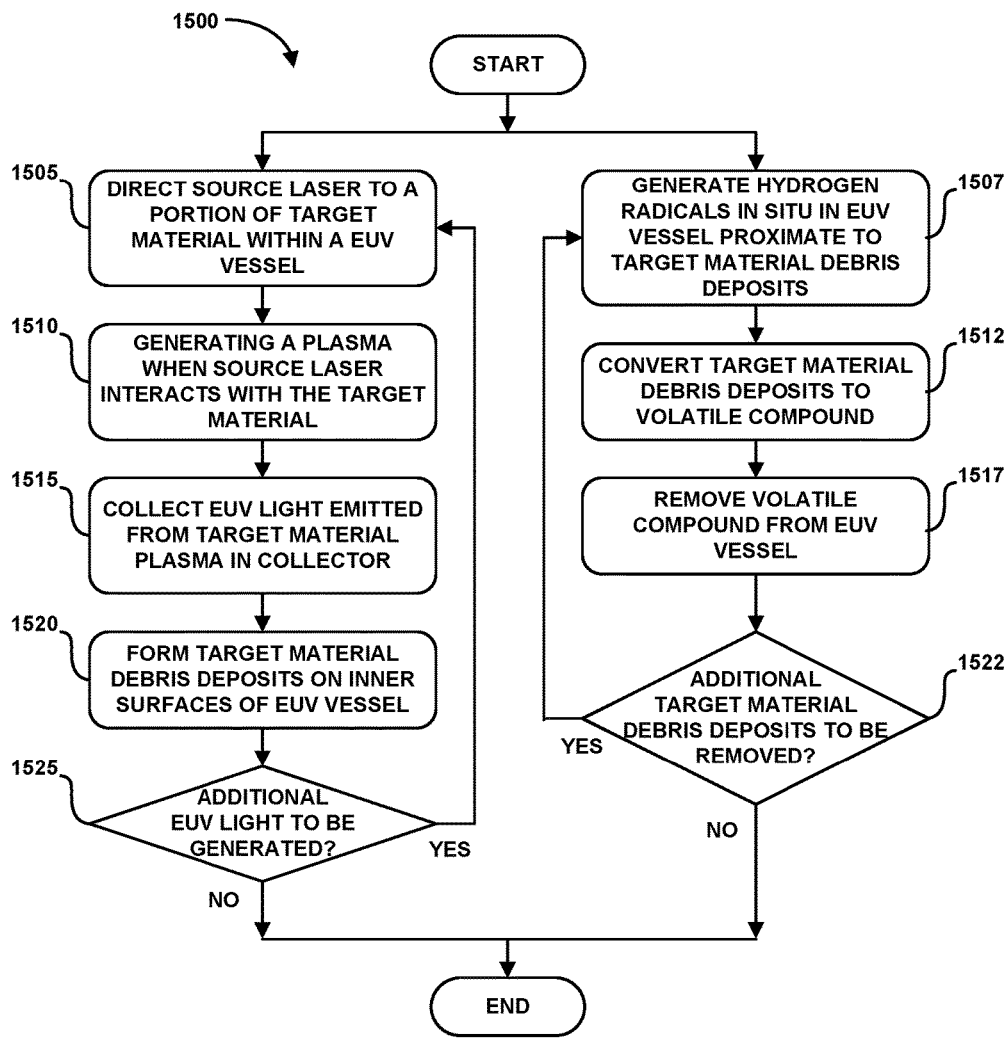
FIG. 15 is a flowchart diagram that illustrates the method operations performed in producing EUV light while simultaneously removing target material debris deposits in the EUV vessel, in accordance with embodiments of the disclosed subject matter.

FIG. 15 is a flowchart diagram that illustrates the method operations 1500 performed in producing EUV light while simultaneously removing target material debris deposits in the EUV vessel 26, in accordance with embodiments of the disclosed subject matter. The operations illustrated herein are by way of example, as it should be understood that some operations may have sub-operations and in other instances, certain operations described herein may not be included in the illustrated operations. With this in mind, the method and operations 1500 will now be described.

In an operation 1505, the source laser is directed to a portion of target material within an EUV vessel 26.

In operation 1510, a plasma is generated when the source laser interacts with the target material in the EUV vessel 26. When the source laser interacts with the target material in the EUV vessel, a first portion of the target material is converted to the plasma and a second portion of the target material is cast off as target material debris.

In an operation 1515, EUV light emitted from the plasma is collected in the collector 30. The second portion of the target material settles on various inner surfaces of the EUV vessel 26, in an operation 1520.

In operation 1525, if additional EUV light needs to be generated, then the method operations continue in operation 1505 as described above. If no additional EUV light is needed to be generated than the method operations can end.

Simultaneously, with operation 1505, hydrogen radicals H* are generated in situ in the EUV vessel 26, in an operation 1507. Hydrogen radicals are generated in one or more hydrogen radical sources disposed within the EUV vessel 26.

In operation 1512, the hydrogen radicals H* interact with the target material debris deposits to form a volatile compound. As described above typically, the target material contains tin and the volatile compound created with the interaction of hydrogen radicals H* is $SnH_4$. It should be understood that any suitable volatile compound containing at least a portion of the target material debris deposits can be created in operation 1512.

In operation 1517, the volatile compound created in operation 1512 is removed from the EUV vessel 26. The volatile compound can be removed by purging or by evacuating the EUV vessel 26 and combinations thereof.

In operation 1522 if additional target material debris deposits need to be removed then the method operations continue in operation 1507 above. If no additional target material debris deposits need to be removed from the EUV vessel 26 and the method operations can end. It should be noted that the target material debris deposits removal in operations 1507 to 1522 can be conducted simultaneously with generation of the EUV in operations 1505 to 1525 in the EUV vessel 26. In other implementations, the target material debris deposits removal in operations 1507 to 1522 can be conducted in an overlapping or an alternating fashion with generation of the EUV in operations 1505 to 1525.

In one implementation, the in situ cleaning process includes generating and injecting hydrogen radicals in various locations around the EUV vessel at a flow rate of about 90 slm while maintaining the pressure at about 1.3 Torr and the signal source 1312 providing a signal of between about several kHz to 100s of MHz RF at a power of between about 1 kW to several kW depending on the desired cleaning rate. It should be understood that these are merely example flow rates, RF frequency and RF power and that lesser or greater flow rates, RF frequencies and RF powers and combinations thereof can be utilized. It should also be understood that the hydrogen radical generation and injection can be a different flow rate, RF frequency, and RF power in one or more of the local portions of the EUV vessel, as may be needed to address additional target material debris proximate to the respective outlets of each of the hydrogen radical sources disposed around the interior of the EUV vessel.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An extreme ultraviolet (EUV) light source comprising:
an EUV vessel having an EUV vessel purge gas inlet, the EUV purge gas inlet being configured to be coupled to a purge gas source for dispensing a quantity of purge gas into the EUV vessel;
an EUV collector disposed in the EUV vessel, the EUV collector having a reflective surface;
a target material source for dispensing a quantity of target material into the EUV vessel;
a hydrogen radical source disposed within the EUV vessel, the hydrogen radical source comprising a capacitively coupled hydrogen plasma chamber, the capacitively coupled hydrogen plasma chamber comprising:
a hydrogen radical source outlet disposed proximate to the reflective surface of the EUV collector;
a hydrogen source inlet configured to be coupled to a hydrogen source;
a hydrogen source electrode configured to be coupled to a signal source and disposed within the EUV vessel for generating a capacitively coupled plasma during operation of the EUV light source to produce hydrogen radicals that combine with at least a portion of a target material debris deposit disposed on the reflective surface of the EUV collector to generate a volatile compound; and an EUV vessel purge outlet for passing the volatile compound out of the EUV vessel.

2. The EUV light source of claim 1, wherein the EUV collector has a central aperture and the hydrogen radical source outlet is disposed proximate to the central aperture so that hydrogen radicals generated during operation of the EUV light source pass through the central aperture.

3. The EUV light source of claim 1, wherein the EUV collector has a central aperture and the hydrogen radical source is a first hydrogen radical source disposed proximate to the central aperture, and the EUV light source further comprises:
a second hydrogen radical source disposed proximate to the central aperture, each of the first and second hydrogen radical sources disposed proximate to the central aperture so that hydrogen radicals generated during operation of the EUV light source pass through the central aperture.

4. An extreme ultraviolet (EUV) light source, comprising:
an EUV vessel having an EUV vessel purge gas inlet and an EUV vessel purge gas outlet, the EUV vessel purge gas inlet being configured to be coupled to a purge gas source for supplying a quantity of purge gas into the EUV vessel;
an EUV collector disposed in the EUV vessel, the EUV collector having a reflective surface;
a target material dispenser for supplying a quantity of target material into the EUV vessel; and
a hydrogen radical source disposed within the EUV vessel, the hydrogen radical source being defined by a capacitively coupled hydrogen plasma chamber having at least one grounded wall and an electrode coupled to a signal source, the hydrogen radical source is configured to receive a flow of hydrogen and produce hydrogen radicals proximate to the reflective surface of the EUV collector when the signal source is active during operation,
wherein during operation the hydrogen radicals combine with a portion of target material disposed on the reflective surface to remove the portion of target material as a volatile compound, the EUV vessel purge gas outlet used to purge the volatile compound from the EUV vessel.

5. The EUV light source of claim 4, wherein the hydrogen radical source is disposed within the EUV vessel so that hydrogen radicals are provided at a perimeter of the EUV collector during operation.

6. The EUV light source of claim 5, wherein the hydrogen radical source is disposed within the EUV vessel so that hydrogen radicals are provided at a perimeter of the EUV collector during operation, wherein the EUV collector has a central aperture, and wherein the EUV light source comprises an additional hydrogen radical source disposed behind the EUV collector so that hydrogen radicals are provided near the central aperture of the EUV collector during operation.

7. The EUV light source of claim 4, wherein the EUV collector has a central aperture, and the hydrogen radical source is disposed behind the EUV collector so that hydrogen radicals are provided near the central aperture of the EUV collector during operation.

8. The EUV light source of claim 4, wherein additional hydrogen radical sources are provided to define a plurality of hydrogen radical sources disposed within the EUV vessel, the plurality of hydrogen radical sources being disposed within the EUV vessel so that hydrogen radicals are provided around a perimeter of the EUV collector during operation.

9. The EUV light source of claim 8, wherein the plurality of hydrogen radical sources are symmetrically disposed around the perimeter of the EUV collector.

10. The EUV light source of claim 8, wherein the EUV collector has a central aperture, and wherein the EUV light source comprises an additional hydrogen radical source disposed behind the EUV collector so that hydrogen radicals are provided near the central aperture of the EUV collector during operation.

* * * * *